(12) United States Patent
Kim et al.

(10) Patent No.: US 7,452,423 B2
(45) Date of Patent: Nov. 18, 2008

(54) DIFFUSION SYSTEM

(75) Inventors: Jun-young Kim, Gyeonggi-do (KR); Byoung-lyong Choi, Seoul (KR); Eun-kyung Lee, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 368 days.

(21) Appl. No.: 10/912,059

(22) Filed: Aug. 6, 2004

(65) Prior Publication Data

US 2005/0092244 A1     May 5, 2005

(30) Foreign Application Priority Data

Oct. 29, 2003    (KR) ..................... 10-2003-0075814

(51) Int. Cl.
*C23C 16/448* (2006.01)
*C23C 16/455* (2006.01)
*C23F 1/00* (2006.01)
*C23C 16/22* (2006.01)

(52) U.S. Cl. .................. 118/719; 118/715; 156/345.31; 156/345.33; 156/345.37

(58) Field of Classification Search ................ 118/715, 118/719; 156/345.33–36, 345.31, 345.37
See application file for complete search history.

(56) References Cited

U.S. PATENT DOCUMENTS

| | | | |
|---|---|---|---|
| 3,808,035 A | 4/1974 | Stelter | |
| 4,566,918 A * | 1/1986 | Irvine et al. | 438/509 |
| 4,783,343 A | 11/1988 | Sato | |
| 5,118,286 A * | 6/1992 | Sarin | 432/2 |
| 5,186,120 A | 2/1993 | Ohnishi et al. | |
| 5,252,062 A * | 10/1993 | Groves et al. | 432/205 |
| 5,462,899 A | 10/1995 | Ikeda | |
| 5,489,550 A | 2/1996 | Moslehi | |
| 5,575,854 A | 11/1996 | Jinnouchi et al. | |
| 5,989,345 A * | 11/1999 | Hatano | 118/715 |
| 6,015,594 A * | 1/2000 | Yoshikawa | 427/398.1 |
| 6,263,831 B1 * | 7/2001 | Gorin | 118/723 IR |
| 2002/0036066 A1 * | 3/2002 | Ogawa et al. | 156/345 |

FOREIGN PATENT DOCUMENTS

JP          54-134100       * 10/1979

(Continued)

OTHER PUBLICATIONS

Partial European Patent Office Search Report.

(Continued)

*Primary Examiner*—Rudy Zervigon
(74) *Attorney, Agent, or Firm*—Buchanan Ingersoll & Rooney PC

(57) ABSTRACT

Provided is a diffusion system for forming a doping layer in a wafer. The diffusion system includes a bubbler for generating a doping gas; a premixer, which premixes the doping gas with reactive gases and preheats the gas mixture; a main chamber, in which the gas mixture reacts to the wafer; a buffer case, which externally isolates an exhaust port and a door for loading and unloading the wafer into and out or the main chamber; and a used gas exhaustion system, which exhausts a used gas after the reaction is finished in the main chamber.

22 Claims, 9 Drawing Sheets
(1 of 9 Drawing Sheet(s) Filed in Color)

FOREIGN PATENT DOCUMENTS

| | | |
|---|---|---|
| JP | 59 049829 | 3/1984 |
| WO | 98/30731 | 7/1998 |
| WO | WO 99/09233 | 2/1999 |
| WO | 03/048413 A1 | 6/2003 |

OTHER PUBLICATIONS

European Search Report dated Apr. 25, 2005.
Chinese Office Action dated Apr. 6, 2007 and English translation.

* cited by examiner

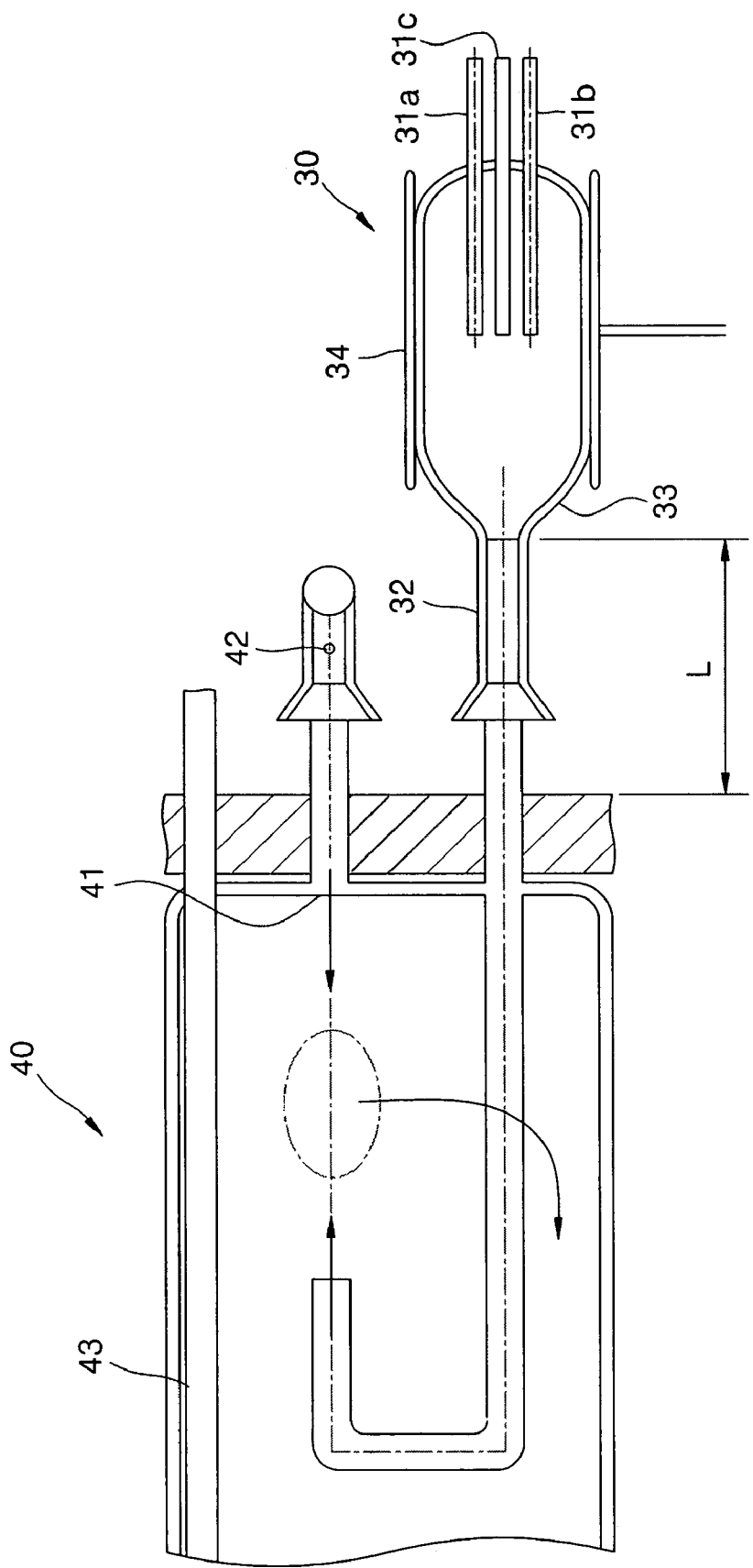

FIG. 5A
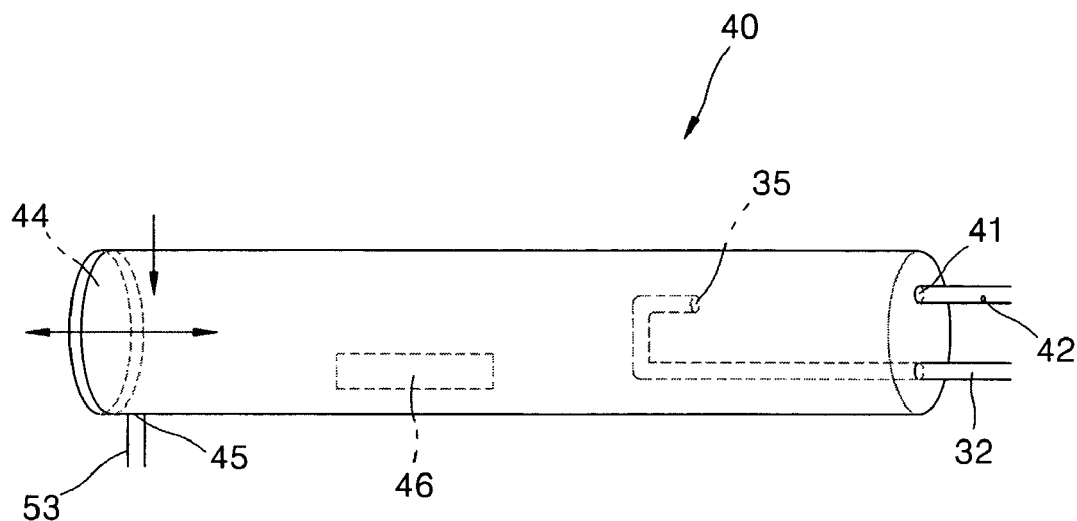
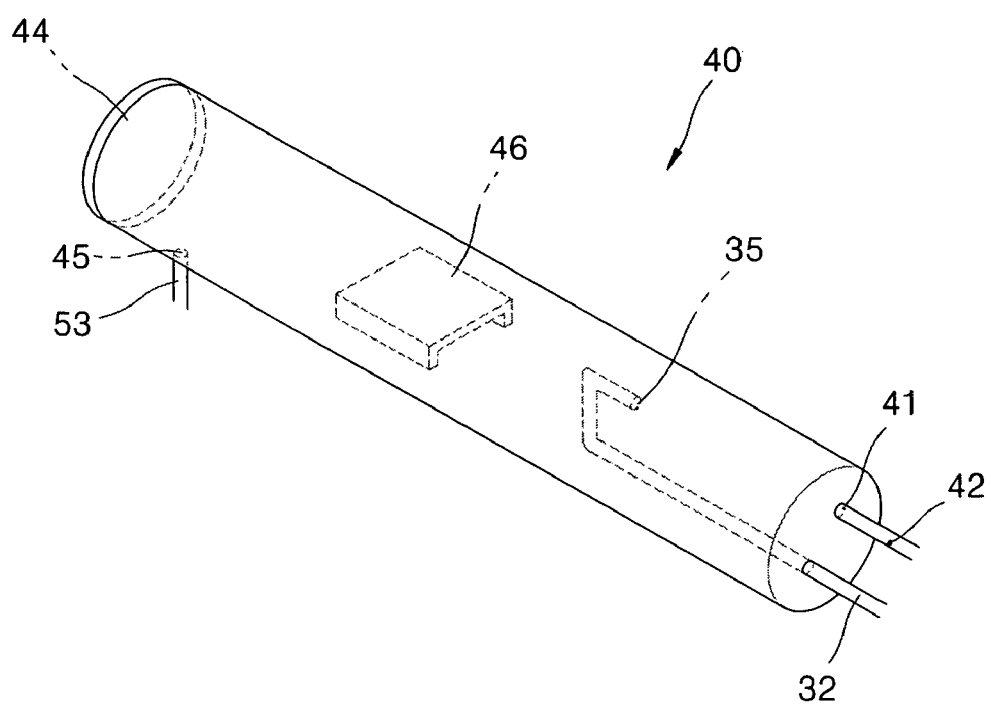

DIFFUSION SYSTEM

This application claims the priority of Korean Patent Application No. 2003-75814, filed on Oct. 29, 2003, in the Korean Intellectual Property Office, the disclosure of which is incorporated herein in its entirety by reference.

BACKGROUND OF THE INVENTION

1. Field of the Invention

The present invention relates to a diffusion system, and more particularly, to a diffusion system for forming an ultrathin doping layer in a wafer. The diffusion system uniformizes the concentration of a mixed gas for forming the doping layer in a short amount of time, includes a cooling rate controller for securing a high frequency response, and provides a flow system for allowing a stable gas flow.

2. Description of the Related Art

A material doped into a semiconductor device is selected in consideration of a diffusion coefficient, a solid-solubility characteristic, a mask effect of an oxide layer, and the like. Even if combined atoms are separated from a doping material during a diffusion process, the atoms must not act as another dopant atoms that may be doped into a wafer or produce an unetchable material on the wafer. A material that is doped into a wafer should have few impurities, and the concentration of the material should be easily controlled at a constant level in spite of repeated processes. Generally, a doping material remains combined with oxygen, hydrogen, or halogens such as chlorine or bromine and is categorized into a solid, a liquid, and a gas.

Meanwhile, a diffusion system includes a diffusion tube, a heater, a boat, and a dopant delivery system. Depending on the type of a wafer or device to be manufactured, the diffusion system can be categorized into a sealed-tube system, an open-tube system, a box-type system, a paint-on system, and a rapid thermal processing system.

A conventional diffusion system lacks high frequency response and robust characteristics against external disturbances, which are required to form an ultrathin doping layer with a thickness of 100 nm or less, namely, a doping layer for diffusing thermal energy. In other words, to form a nanometer doping layer, the diffusion system requires a high frequency response characteristic so that the concentration of a gas mixture can be rapidly uniformized and the speed with which a wafer that has undergone a doping process is cooled can be finely adjusted. In addition, a flow system and respective apparatuses should be closely connected to one another so as to stably supply a gas mixture and exhaust a used gas. However, the conventional diffusion system cannot systemically fulfill the foregoing requirements.

SUMMARY OF THE INVENTION

The present invention provides a diffusion system which uniformizes the concentration of a gas mixture in a short amount of time, effectively controls the speed with which a wafer that has undergone a diffusion process is cooled, and stably exhausts a waste gas.

According to an aspect of the present invention, there is provided a diffusion system for forming a doping layer in a wafer. The diffusion system comprises a bubbler that generates a doping gas; a premixer that premixes the doping gas with reactive gases and preheats the gas mixture; a main chamber, in which the gas mixture reacts to the wafer; a buffer case that externally isolates an exhaust port and a door for loading and unloading the wafer into and out of the main chamber; and a used gas exhaustion system that exhausts a used gas after the reaction is finished in the main chamber.

The bubbler may include a container that contains a doping material; an absorbing tube that absorbs a carrier gas for carrying the doping gas; a carrier tube that carries the doping gas for carrying the doping material carried by the carrier gas; a pressure regulator that measures the pressure of the container and regulates the pressure of the container to a predetermined value; and a bypass tube that exhausts gases contained in the bubbler using a bypass valve when the pressure of the bubbler exceeds a predetermined value.

The premixer may include a premixer container; one or more gas carrier tubes that carry the doping gas and the reactive gases; a gas mixture supply tube that supplies the gas mixture from the premixer container to the main chamber; and a heater that controls the temperature of the premixer.

The gas carrier tubes may extend into the premixer container to spray gases.

A portion of the premixer container, which exhausts the gas mixture to the gas mixture supply tube, may have a tapering or conic shape to prevent a whirl in corners of the premixer container.

The diameter of the gas mixture supply tube may be 1.7 times or more greater than the diameter of each of the gas carrier tubes.

The main chamber may include an atmospheric gas nozzle that is formed on one side of the main chamber and sprays an atmospheric gas; a gas mixture nozzle that sprays a gas mixture containing a doping gas in an opposite direction to a direction in which the atmospheric gas nozzle sprays the atmospheric gas such that the atmospheric gas is mixed with the doping gas; the door via which the wafer is loaded into and unloaded out from the main chamber; and the exhaust port that exhausts a remaining used gas after the doping gas reacts with the wafer.

The gas mixture nozzle may be a back nozzle formed at a terminal portion of the gas mixture supply tube that extends from the premixer into the main chamber.

The diffusion system may further include a reactive gas tube that is connected to one side of an atmospheric gas tube, which is connected to the atmospheric gas nozzle and supplies the atmospheric gas to the main chamber, and supplies a reactive gas to the atmospheric gas tube.

The door may have a double insulation structure formed of quartz and graphite, which are sequentially stacked.

The buffer case may hermetically seal the door and the exhaust port of the main chamber, and a shower nozzle for spraying a cooling gas may be formed at an exhausting tube connected to the door and the exhaust port.

The waste gas exhausting system may include a supporting system that prevents a sag in the exhausting tube due to the high-temperature waste gas; and a scrubber that finally exhausts the waste gas.

The supporting system may include a spring that supports the exhausting tube in a radial direction to prevent a sag in the exhausting tube due to thermal expansion; and a bellows that corrects thermal expansion of the exhausting tube in an axial direction and cools the waste gas with an increased surface area.

According to another aspect of the present invention, there is provided a premixer for supplying a gas mixture containing a doping gas to a main chamber in which the gas mixture reacts to a wafer. The premixer includes a premixer container; one or more gas carrier tubes that receive the doping gas and reactive gases; a gas mixture supply tube that supplies the gas mixture from the premixer container to the main chamber; and a premixer heater that controls the temperature of the premixer.

According to yet another aspect of the present invention, there is provided a main chamber of a diffusion system in which a wafer reacts to gases. The main chamber may include an atmospheric gas nozzle that is formed on one side of the main chamber and sprays an atmospheric gas; a gas mixture nozzle that sprays a gas mixture containing a doping gas in an opposite direction to a direction in which the atmospheric gas nozzle sprays the atmospheric gas such that the atmospheric gas is mixed with the doping gas; a door, via which the wafer is loaded into and unloaded from the main chamber; and an exhaust port that exhausts a remaining used gas after the doping gas reacts to the wafer.

According to further another aspect of the present invention, there is provided a waste gas exhausting system for exhausting a remaining waste gas from a main chamber after a wafer reacts to gases. The waste gas exhausting system comprises an exhausting tube, through which the waste gas flows to an exhaust port of the main chamber; a supporting system that prevents a sag in the exhausting tube due to the high-temperature waste gas and cooling the waste gas; and a scrubber finally that exhausts the waste gas using a vacuum pump connected to a terminal portion of the scrubber.

BRIEF DESCRIPTION OF THE DRAWINGS

The application file contains at least one drawing executed in color. Copies of this patent application with color drawings are enclosed.

The above and other features and advantages of the present invention will become more apparent by describing in detail exemplary embodiments thereof with reference to the attached drawings in which:

FIG. 4 shows a connecting portion between the premixer of FIG. 3 and a main chamber in the diffusion system shown in FIG. 1B;

FIG. 5A shows a main chamber of the diffusion system shown in FIG. 1B;

DETAILED DESCRIPTION OF THE INVENTION

The present invention will now be described more fully with reference to the accompanying drawings, in which exemplary embodiments of the invention are shown. It should be understood that the drawings are exaggerated for clarity of explanation.

Figure 1A:
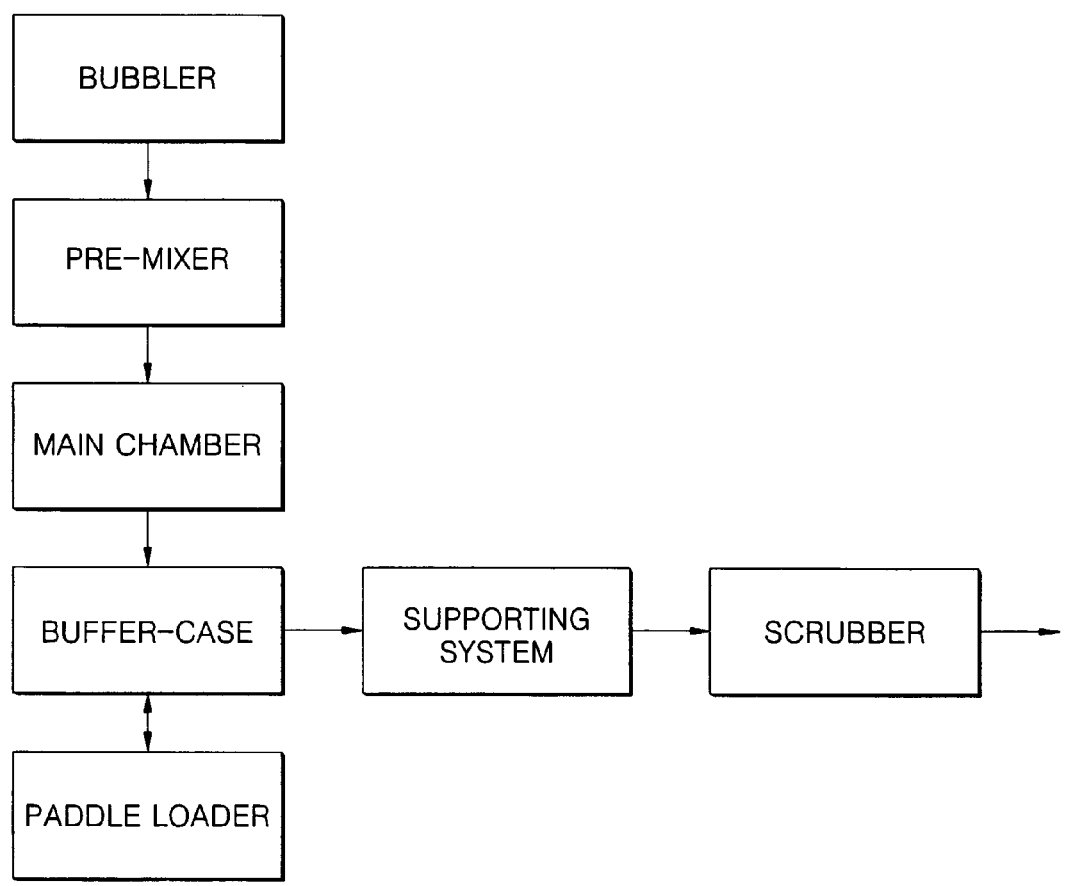
FIG. 1A is a block diagram of a diffusion system according to the present invention, showing gas flow and directions in which a wafer is loaded and unloaded.
Figure 1B:
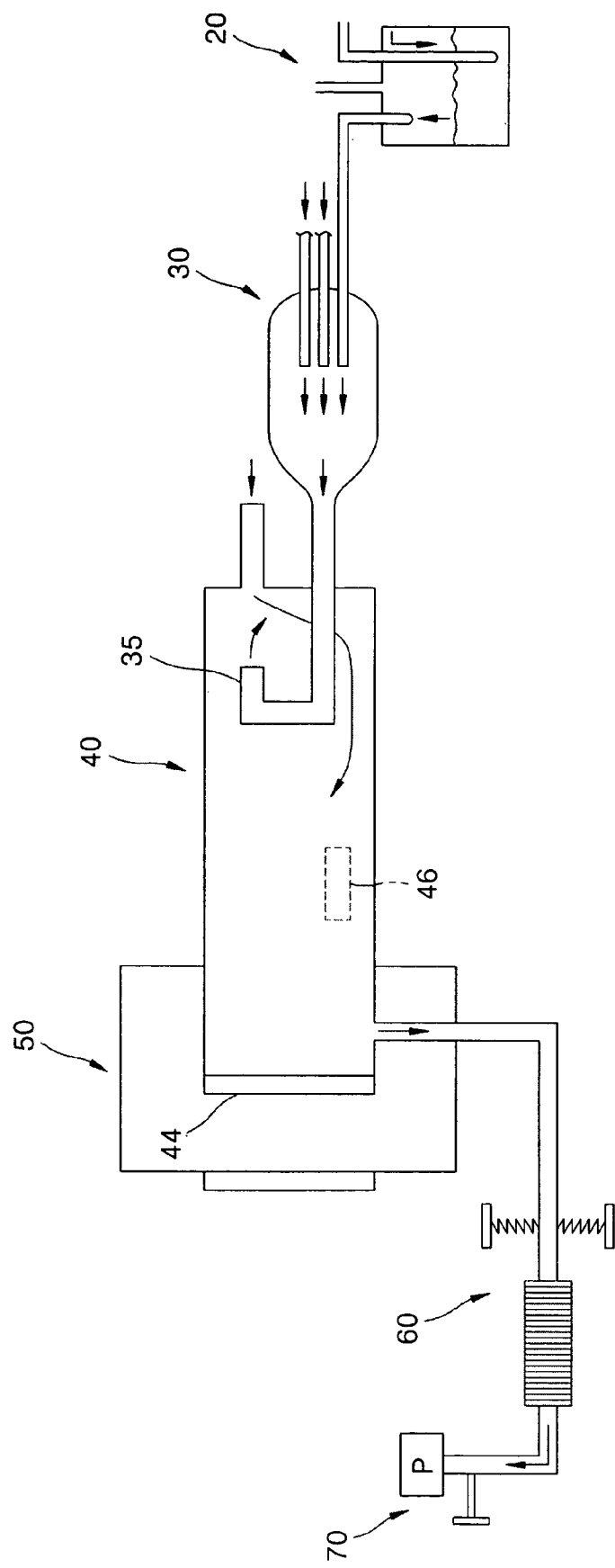
FIG. 1B is a cross-sectional view of the diffusion system shown in FIG. 1.

Referring to FIGS. 1A and 1B, a diffusion system according to the present invention includes a diffusion preprocessing portion, a main chamber 40, and a diffusion postprocessing portion.

The diffusion preprocessing portion includes a bubbler 20, a premixer 30, and a back nozzle 35. The bubbler 20 generates a doping gas, and the premixer 30 premixes the generated doping gas at an appropriate temperature and preheats the same. The back nozzle 35 uniformly mixes the preheated gas with an atmospheric gas in the main chamber 40. Inside the main chamber 40, the doping gas is uniformly mixed with the atmospheric gas and reacts to a wafer, which is loaded in or unloaded from the main chamber 40 via a door 46 included in the main chamber 40. The diffusion postprocessing portion includes a buffer case 50, a supporting system 60, and a scrubber 70. The buffer case 50 cools the wafer and a waste gas exhausted from the main chamber 40 after a diffusion process. The supporting system 60 stably exhausts a high-temperature waste gas, and the scrubber 70 stably processes the waste gas. Accordingly, after the doping gas is generated and reacts to the wafer, the doping gas flows through the bubbler 20, the premixer 30, the back nozzle 35, the main chamber 40, and the buffer case 50, is exhausted through the supporting system 60 and the scrubber 70.

Figure 2:
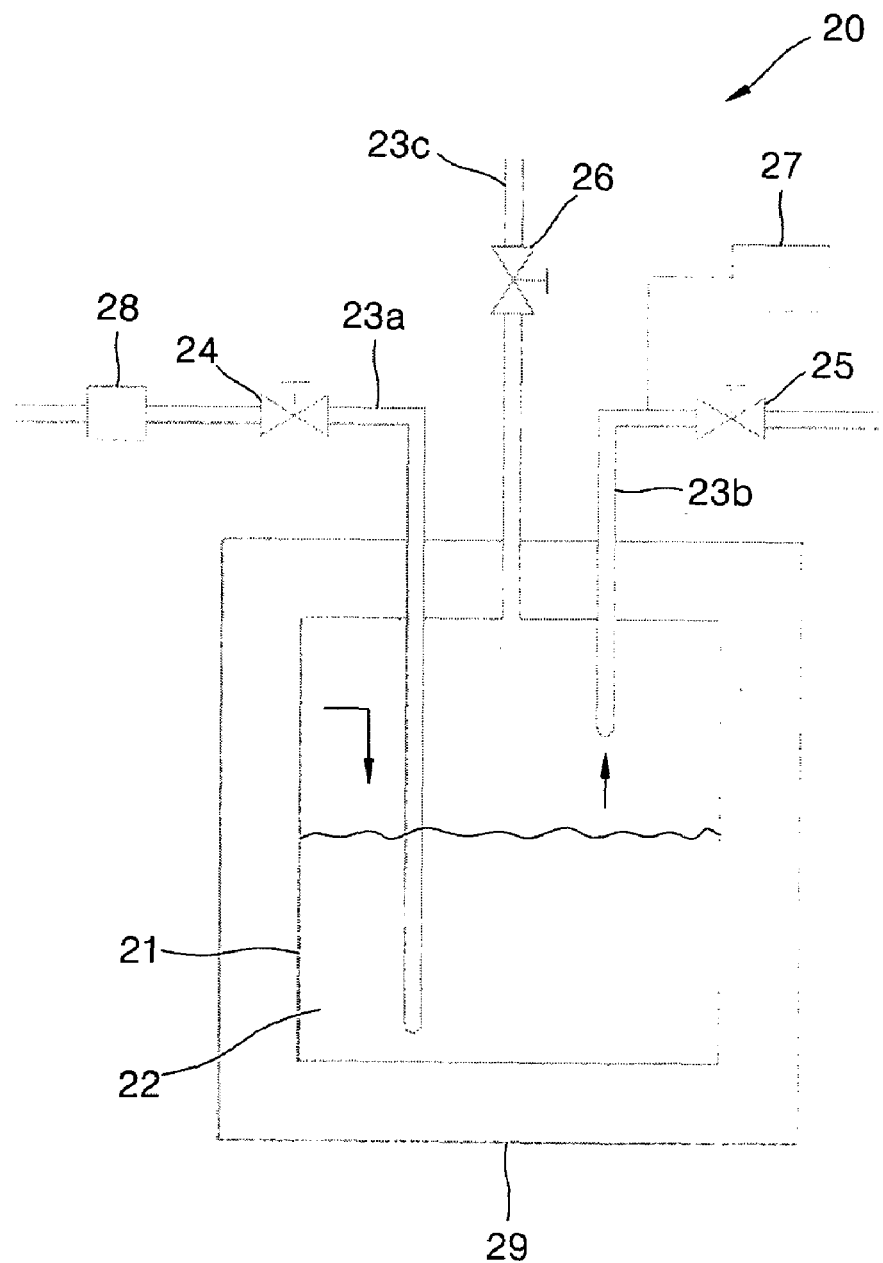
FIG. 2 shows a bubbler of the diffusion system shown in FIG. 1B.

FIG. 2 shows the bubbler 20 of the diffusion preprocessing portion described above. The bubbler 20 includes not only basic elements such as a mass flow controller (MFC) 28, an in-valve 24, and an out-valve 25, but also a bypass valve 26 and a pressure regulator 27.

Referring to FIG. 2, the bubbler 20 of the diffusion system includes three tubes 23a, 23b, and 23c, which are connected to a container 21 for containing a doping material 22. The tubes 23a, 23b, and 23c are respectively an absorbing tube 23a, a carrier tube 23b, and a bypass tube 23c. The absorbing tube 23a, to which the in-valve 24 is attached, absorbs a carrier gas, such as nitrogen, and carries the carrier gas into the container 21. The carrier tube 23b allows the out-valve 21 to carry the doping material 22 from the container 21 to the premixer 30. Also, if the pressure of the container 21 exceeds a predetermined value, the bypass tube 23c allows the bypass valve 26 to exhaust the remaining gas from the container 21. The pressure regulator 27 is used to measure a pressure in the container 21 of the bubbler 20.

The bubbler 20 of the diffusion system according to the present invention improves stability using a double measurement, which will now be described in detail. At the outset, if the pressure of the container 21 exceeds a predetermined value, the pressure regulator measures the pressure, and an external controller (not shown) senses the pressure and electrically insulates the in-valve 24. If the pressure of the container 21 abruptly increases, a gas contained in the container 21 is mechanically exhausted by opening the bypass valve 26, and then processed using the scrubber 70. This double measurement prevents an unexpected elevation of the pressure in the container 21. A reference exhausting pressure of the bypass valve 26 can be preset to a higher value than a reference pressure of the pressure regulator 27. Also, for safety reasons, the container 21 of the bubbler 20 is located within an isolation box 29 and isolated from an external connection.

The gas, of which pressure is appropriately controlled by both the pressure regulator 27 and the bypass valve 26, flows through the out-valve 25 and the carrier tube 23b into the premixer 30. Here, a distance between the bubbler 20 and the premixer 30 is preferred to be minimized to reduce a duct resistance, since the duct resistance is proportional to distance and inversely proportional to the third power of a radius of the duct.

Figure 3:
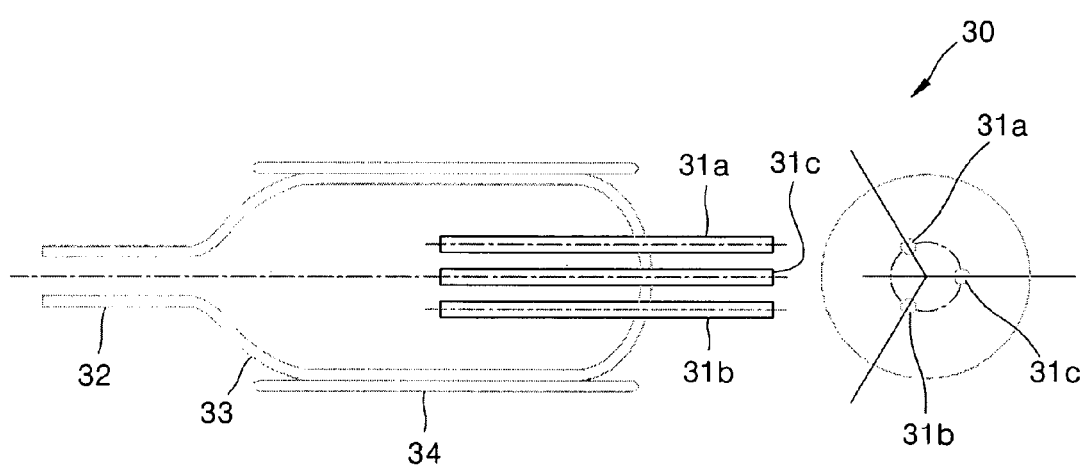
FIG. 3 shows a premixer of the diffusion system shown in FIG. 1B.

FIG. 3 shows the premixer 30 of the diffusion system shown in FIG. 1B. Referring to FIG. 3, the premixer 30 includes a supply tube 32 and a heater 34. The supply tube 32 supplies a gas to the carrier tube 23b connected to the bubbler 20 and the main chamber 40. The heater 34 controls the temperature of the premixer 30. The premixer 30 receives a gas to be used in the main chamber 40 from the bubbler 20, controls the gas to a predetermined temperature and composition, and carries the gas to the main chamber 40. Further, the heater 34 heats the gas to be supplied to the main chamber 40 as much as a process temperature of the main chamber 40.

The premixer 30 of the diffusion system includes carrier tubes 31a, 31b, and 31c, which extend to the center of the premixer 30 so as to carry supply gases containing the gas carried by the bubbler 20 to the main chamber 40 without congestion. The carrier tubes 31a, 31b, and 31c each have more than 2.5 times the diameter of the supply tube 32 such that carried gases are exhausted through the supply tube 32 without congestion.

To flow through a tube without congestion, a gas has to satisfy the minimum condition given in Equation 1. Here, it is assumed that the mass flow rate of an input gas is equal to the mass flow rate of an output gas, and three tubes for carrying gases to the premixer 30 are installed including a tube for supplying a gas from the bubbler 20 to the premixer 30.

$$3di^2 = Do^2 \quad (1)$$

wherein di is the diameter of each of the carrier tubes 31a, 31b, and 31c for carrying gases to the premixer 30, and Do is the diameter of the supply tube 32 for supplying a reactive gas to the main chamber. Accordingly, when the three carrier tubes 31a, 31b, and 31c and one supply tube 32 are used, Do should be about 1.7 times greater than di. If the mass flow rates of gases that are respectively supplied from the carrier tubes 31a, 31b, and 31c are different from one another, Do should be 1.7 times or more greater than di and, more preferably, twice or more greater than di. Also, the carrier tubes 31a, 31b, and 31c can each have a far smaller diameter so as to prevent gases from flowing back.

A portion 33 of a container of the premixer 30 near the supply tube 32 through which gases are exhausted from the premixer 30 to the main chamber is produced in a tapering or conic shape to prevent a whirl in corners of the container. In the above-described process, a gas is supplied from the bubbler 20 through the premixer 30 to the main chamber without congestion. Preferably, the gas is mixed with other gases in the premixer 30 until it reaches a predetermined temperature. Accordingly, although the size of the container of the premixer 30 should be controlled depending on a desired process, the container has preferably a small capacity.

The gases carried from the bubbler 20 are mixed in the premixer 30 and react with each other. Then, the gas mixture is heated to nearly a process temperature of the main chamber by the heater 34 that surrounds the outer surface of the premixer 30. For example, if a process temperature in the main chamber is about 800 to 1100° C., the premixer 30 is preheated to a temperature of about 500 to 800° C. The process temperature is automatically controlled to a preset value by the controller.

FIG. 4 shows a connection portion between the premixer 30 and the main chamber 40 in the diffusion system shown in FIG. 1B. Referring to FIG. 4, the supply tube 32, which supplies a reactive gas from the premixer 30 to the main chamber 40, includes a back nozzle 35 to uniformize the concentration of the reactive gas in the main chamber 40.

To be more specific, a gas is supplied from the premixer 30 by the supply tube 32 and doped into a wafer loaded in the main chamber 40. In this case, to form a doping layer with a desired thickness, a process time taken to expose the wafer to a gas mixture and the concentration of the gas mixture inside the main chamber 40 should be finely adjusted.

After a lapse of a process time preset by the controller, a waste gas that remains in the main chamber 40 is exhausted, and the wafer is unloaded out of the main chamber 40 by a paddle loader used for carrying wafers. However, it is difficult to uniformize the concentration of the gas mixture in the main chamber 40 only by operation of valves. In particular, to obtain an ultrathin doping layer, it is required to uniformize the concentration of the gas mixture in the main chamber in a short amount of time.

Therefore, an outlet of the supply tube 32 for allowing the gas mixture to flow from the premixer 30 into the main chamber 40 can face an outlet of an atmospheric gas nozzle 41 from which an atmospheric gas is sprayed, such that the gas mixture is mixed with the atmospheric gas. As shown in FIG. 4, the atmospheric gas is sprayed from the atmospheric gas nozzle 41 across the gas mixture containing a doping material that is supplied from the supply tube 32. In this structure, the concentration of the entire gas within the main chamber 40 can be uniformized in a short amount of time.

The supply tube 32 includes the back nozzle 35, which serves to mix the gas that is heated and mixed by the premixer 30 with a main flow of the atmospheric gas. The back nozzle 35 allows the gas including the atmospheric gas in the main chamber 40 to steadily flow along a stream line of the main flow without disturbance in a short amount of time. Thus, the concentration of a gas in the chamber 40 is uniformized in a short amount of time, thereby forming an ultrathin doping layer having a thickness of 100 nm or less. Typically, the atmospheric gas is an inert gas, such as nitrogen or argon.

If the gas mixture is not formed to a desired concentration in the premixer 30, another supply tube 42 is connected to a portion of an atmospheric gas tube that is connected to the atmospheric gas nozzle 41 as a precaution so as to supply a required gas along with the atmospheric gas. Thus, the concentration of the gas mixture in the main chamber 40 can be controlled to a desired level.

Here, the back nozzle 35 of the supply tube 32 may not aligned to exactly face the atmospheric gas nozzle 41. Also, a carrier line of the supply tube 32 may not be bent in the form of a duct within the main chamber 40. However, a direction in which the back nozzle 35 sprays a gas can be set relative to the atmospheric gas nozzle 41 such that the gas mixture forms a laminar flow in accordance with the flow of the inert gas.

FIG. 5A shows the main chamber 40 of the diffusion system shown in FIG. 1B. Referring to FIG. 5A, the back nozzle 35 for supplying a gas mixture is installed at one side of the main chamber 30, in which a reaction between the gas mixture and a wafer occurs, and an atmospheric gas nozzle 41 is installed at the one side of the main chamber 30, which faces the back nozzle 35. An atmospheric gas in the supply tube 32 flows through a portion of the back nozzle 35 and is supplied to the main chamber 40. A first door 44 is formed at a lateral surface of the main chamber 40. A wafer carrier 46 is loaded or unloaded via the first door 44 by a paddle loader (not shown). A wafer, which reacts to the gas mixture having a controlled concentration, is mounted on the wafer carrier 46 and loaded into or unloaded out of the main chamber 40 by the paddle loader while the first door 44 is being opened or closed. An exhaust port 45 for exhausting a used gas is formed near the other side of the main chamber 40 at which the first door 44 is formed. Also, the main chamber 40 includes a heater (43 of FIG. 4) for maintaining the main chamber 40 at a high temperature during reaction and a cooler (not shown) for cooling the main chamber 40.

Figure 5B:
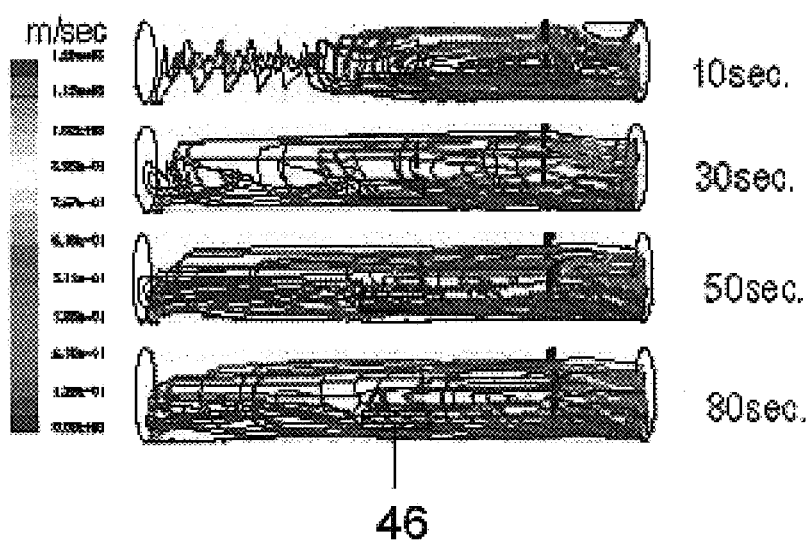
FIG. 5B shows gas flow in the main chamber of FIG. 5A.
Figure 5C:
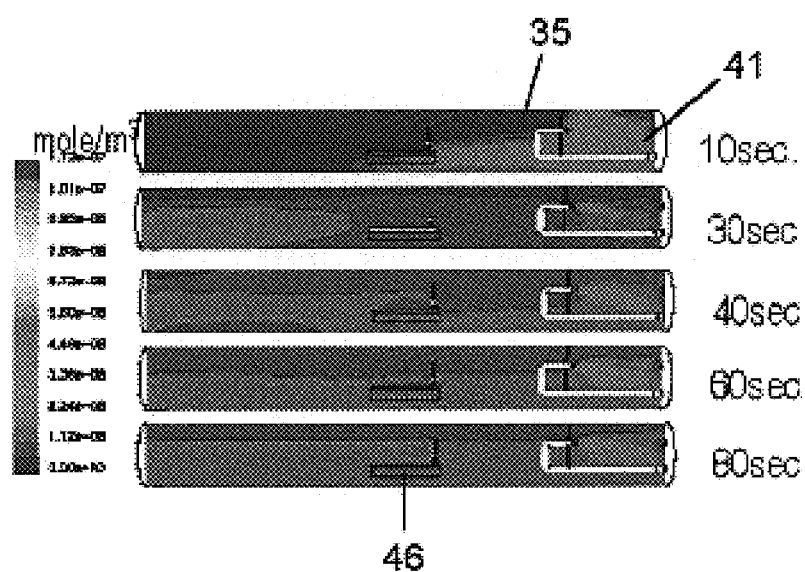
FIG. 5C shows a concentration distribution of a gas mixture relative to time in the main chamber shown in FIG. 5A.
Figure 5D:
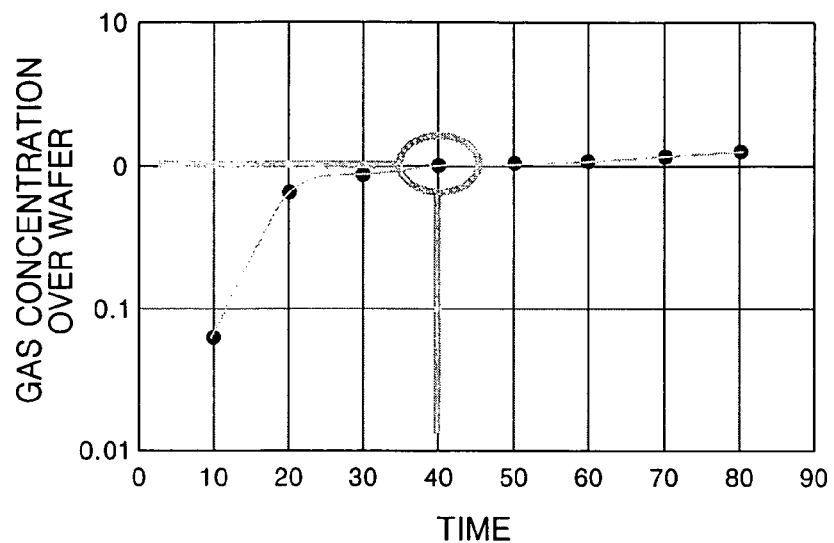
FIG. 5D is a graph showing a variation of the concentration of a gas over time on a wafer in the main chamber shown in FIG. 5A.

FIGS. 5B and 5C illustrate a process of supplying a gas mixture and an atmospheric gas to the main chamber 40 while uniformizing the concentration of gases in the main chamber 40. FIG. 5B shows a stream line of a gas in the main chamber 40, and FIG. 5C shows a concentration distribution of a gas mixture relative to time in the main chamber 40. To be more specific, FIG. 5B illustrates that a gas mixture is supplied from the premixer 30 and forms a laminar flow with an atmospheric gas over time in the main chamber 40. FIG. 5C illustrates a process of uniformizing the concentration of the gas mixture as the atmospheric gas is supplied. In addition, FIG. 5D is a graph showing a concentration variation of the gas mixture over time on a wafer in the main chamber 40. Referring to FIG. 5D, the gas mixture supplied from the premixer 30 to the main chamber 40 is uniformly distributed in less than about 80 seconds, and the distribution of the gas mixture over the wafer becomes uniform in about 40 seconds directly after supply of the gas mixture.

Thus far, the diffusion preprocessing portion including the bubbler 20, the premixer 30, and the back nozzle 35, as well as the main chamber 40 have been described with reference to the drawings. Hereinafter, the diffusion postprocessing portion will be described.

Figure 6:
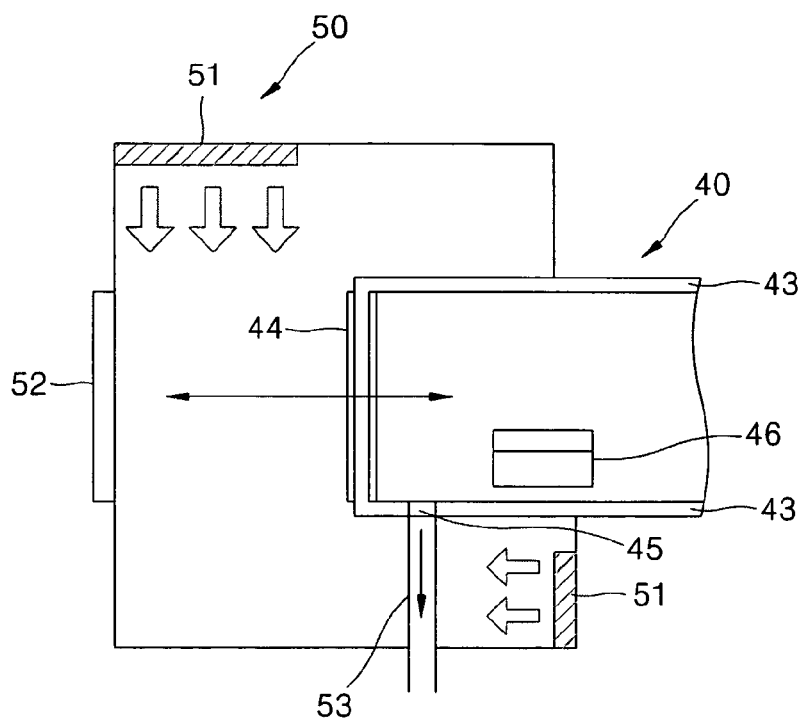
FIG. 6 shows a portion of the main chamber and a buffer case in the diffusion system shown in FIG. 1B.

FIG. 6 shows a main chamber 40 and a buffer case 50 of a diffusion system according to the present invention. In the main chamber 40, a gas mixture reacts to a wafer. The buffer case 50 hermetically seals the main chamber 40, and the wafer is loaded and unloaded via the buffer case 50.

A first door 44, which allows a wafer carrier 46 to be loaded into or unloaded out of the man chamber 40, is formed at one side of the main chamber 40. The first door 44, which communicates the main chamber 40 with the buffer case 50 and carries the wafer carrier 46, has a double sandwich structure. This double sandwich structure can thermally insulate the buffer case 50 from the high-temperature main chamber 40 and is preferably formed of quartz and graphite, which are sequentially stacked. Quartz is highly resistant to melting at high temperature and graphite has a good thermal transmissivity. Also, the lateral surface of the first door 44 is wrapped by glass fiber insulation, thereby thermally separating the buffer case 50 from the inside of the main chamber 40.

Since a process temperature is sufficiently high, the wafer carrier 46 including the wafer is unloaded from the main chamber 40 and then cooled by a shower nozzle 51. Another shower nozzle 51 is also installed near an exhaust port 45 to cool a high-temperature waste gas. This shower nozzle 51 cools the waste gas by spraying an inert gas such as nitrogen or argon. A second door 52 is formed in the buffer case 50 to carry the wafer unloaded from the main chamber 40 out of the buffer case 50.

Figure 7:
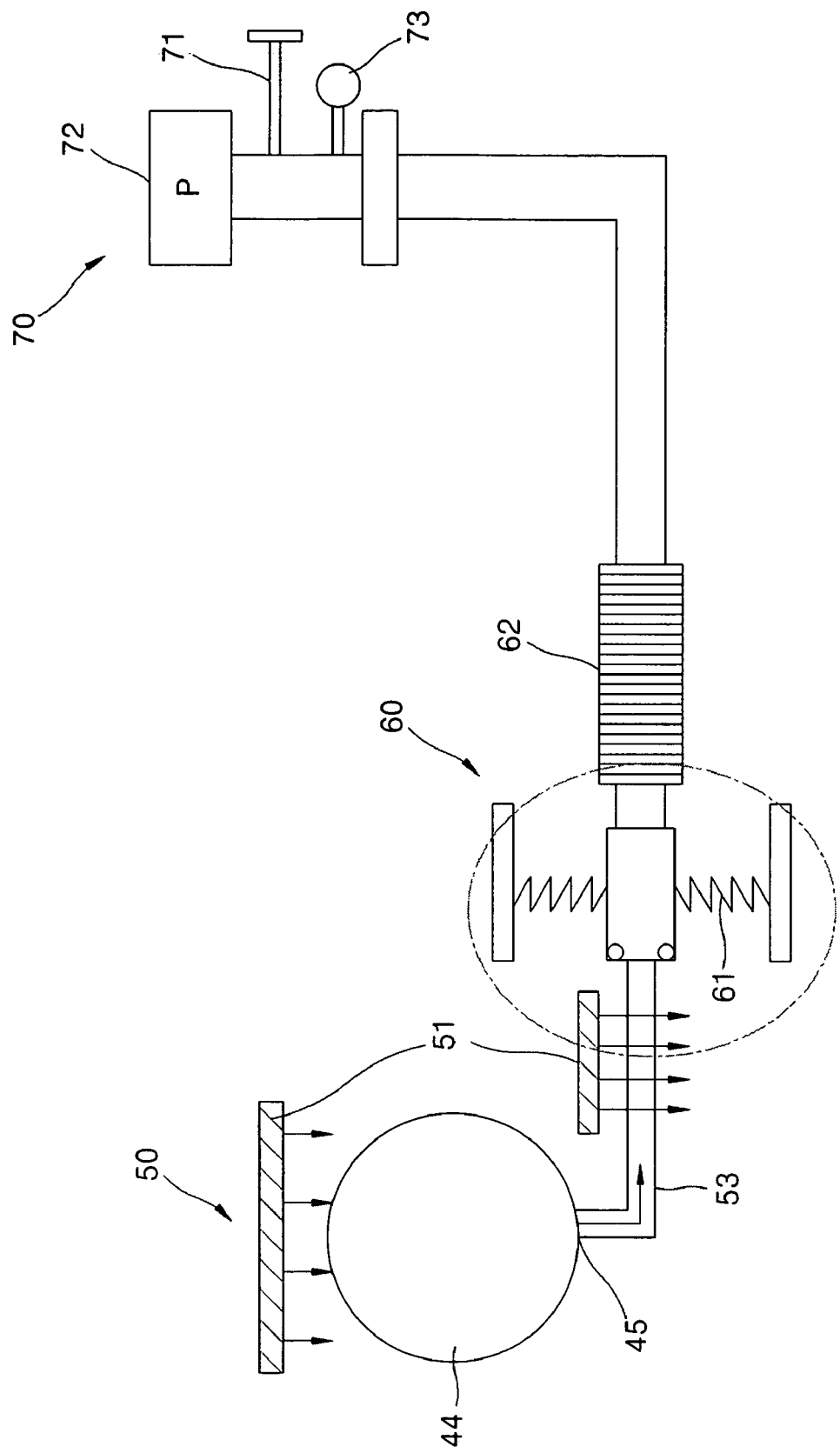
FIG. 7 shows a diffusion postprocessing portion for exhausting a waste gas in the diffusion system shown in FIG. 1B.

Hereinafter, a process of exhausting a waste gas after a diffusion reaction will be described in detail with reference to FIG. 7. FIG. 7 shows a diffusion postprocessing portion for exhausting a waste gas in a diffusion system shown in FIG. 1B.

After a diffusion reaction is finished, i.e., after a gas mixture reacts to a wafer, a waste gas is exhausted from the main chamber 40. Here, a valve (not shown) of the exhaust port 45 is opened and a pump 72 is driven with spraying an atmospheric gas into the main chamber 40. In this process, the waste gas is exhausted. To efficiently exhaust the waste gas, the diffusion postprocessing portion of the diffusion system includes a shower nozzle 51, a supporting system 60, and a scrubber 70.

After the diffusion reaction is finished, the waste gas is exhausted through the exhaust port 45 and an exhausting tube 53. Then, the waste gas is cooled through the buffer case 50 and the supporting system 60 and completely exhausted through the scrubber 70 out of the diffusion system. Since the process temperature of the main chamber 40 may be higher than about 1000° C., the waste gas need to be cooled. As described above, the diffusion system of the present invention includes the shower nozzle 51.

The waste gas is cooled by the buffer case 50 and is further cooled as the waste gas enters the supporting system 60. The supporting system 60 of the present invention has a supporting structure for correcting thermal expansion in axial and radial directions of the exhausting tube 53.

The waste gas, which is exhausted from the main chamber 40 and passes through the exhausting tube 53 around the supporting system 60 may be maintained at about 400 to 500° C. Accordingly, the exhausting tube 53 may thermally expand in axial and radial directions due to the high-temperature waste gas. To prevent a sag in the exhausting tube 53, elastic members 61 such as springs, are attached to upper and lower portions of the exhausting tube 53 in the radial direction of the exhausting tube 53 so that the exhausting tube 53 is supported in a floating state by doubling an elastic coefficient. Also, the hot waste gas is allowed to flow through a bellows 62, which supports the exhausting tube 53 in the axial direction of the exhausting tube 53 like a spring. Here, the bellows 62 increases a contact area between the bellows 62 and the hot waste gas so as to improve cooling efficiency.

In this process, the waste gas flows through the exhausting tube 53 and, finally, is exhausted through a pump installed at a terminal portion of the scrubber 70. An exhausting valve 71 and a pressure gauge 73 appropriately controls the flow rate of exhausted waste gas.

Thus, the diffusion process is finished. Hereinafter, respective operations of the foregoing diffusion process will be briefly described.

At the outset, a gas generated by a carrier gas (e.g., $N_2$) in the bubbler 20 is carried to the premixer 30 via the out-valve 25 under an appropriate pressure that is set up by the pressure regulator 27 and the bypass valve 26.

Next, in the premixer 30, the gas carried from the bubbler 20 is mixed with oxygen (or a reactive gas such as Cl) and heated to an appropriate temperature to minimize influence of a high temperature at which the main chamber is heated.

The gas, which is mixed and heated in the premixer 30, is sprayed from the back nozzle 35 into the main chamber 40 and mixed with an atmospheric gas sprayed from the atmospheric gas nozzle 41. The gas in the main chamber 40 is uniformly distributed throughout the main chamber 40 within about 80 seconds. The concentration distribution of the gas on an actual wafer becomes uniform in about 40 seconds.

Immediately after all the process is finished, the high-temperature doping gas, which is uniformly distributed on the wafer in the main chamber 40, flows through the exhaust port 45 of the main chamber 40 and is exhausted via the supporting system 60 and the scrubber 70 having the pump 72 at a terminal portion. Here, the hot waste gas is cooled by the shower nozzle 51 and the exhausting tube 53 is supported by the spring 61 of the supporting system 60. Thus, the exhausting tube 53 does not sag by thermal expansion.

The first door 44 for blocking radiant heat and convection, which is located within the buffer case 50 and has a double sandwich structure formed of graphite, is opened, and the wafer carrier is detached from the main chamber 40 using the paddle loader and cooled to an appropriate temperature in the buffer case 50. Thus, a diffusion process is completed.

According to the present invention, a diffusion system for forming a doping layer can be provided with high frequency response and robustness. That is, the diffusion system has a high frequency response characteristic since a back nozzle minimizes a time taken to mix gases and a premixer preheats reactive gases to an appropriate temperature. Also, the diffusion system is robust against external disturbances by including an electric regulator and a chemical bypass valve, which ensure stability of a bubbler. In addition, the buffer case prevents a leak of a waste gas after reaction and sets up an appropriate cooling speed, and the supporting system and the scrubber processes the waste gas, thereby providing reliable stability. Consequently, the diffusion system of the present invention can effectively form an ultrathin doping layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A diffusion system for forming a doping layer in a wafer, the system comprising:
   a bubbler generating a doping gas;
   a premixer premixing the doping gas with reactive gases to form a gas mixture and preheating the gas mixture;
   a main chamber, in which the gas mixture reacts with the wafer;
   a buffer case surrounding at least a portion of the main chamber and externally isolating an exhaust port and a door on the main chamber, wherein the wafer is loaded and unloaded via the buffer case and the door into and out of the main chamber;
   a waste gas exhaustion system exhausting waste gas after the reaction is finished in the main chamber; and
   wherein the door has a double insulation structure with a double sandwich structure with two elements with two surfaces combined to form a door, wherein the first element is formed of quartz and the second element is formed of graphite.

2. The system of claim 1, wherein the bubbler comprises:
   a container containing a doping material;
   an absorbing tube absorbing a carrier gas for carrying the carrier gas;
   a carrier tube for carrying the doping material carried by the carrier gas from the container to the premixer;
   a pressure regulator measuring the pressure in the container and regulating the pressure in the container; and
   a bypass tube connected to a bypass valve to exhaust remaining gas from the container and excess gas when the pressure exerted by the doping gas from the bubbler exceeds a predetermined value.

3. The system of claim 1, wherein the premixer comprises:
   a premixer container;
   two or more gas carrier tubes at least one gas carrier tube carrying the doping gas from the bubbler into the premixer container, and at least one gas carrier tube carrying the reactive gases into the premixer container;
   a gas mixture supply tube supplying the gas mixture of the doping gas and the reactive gases from the premixer container to the main chamber; and
   a heater controlling the temperature of the gas mixture in the premixer.

4. The system of claim 3, wherein the gas carrier tubes extend into the center portion of the premixer container to spray gases.

5. The system of claim 3, wherein a first portion of the premixer container that exhausts the gas mixture to the gas mixture supply tube has a tapering or conic interior shape between a second and a third portion of the premixer container, wherein the second portion is between the heater and the two or more gas carrier tubes within the premixer container, and the third portion is adjacent to the gas mixture supply tube.

6. The system of claim 3, wherein the diameter of the gas mixture supply tube (Do) is 1.7 times or more greater than the diameter of each of the gas carrier tubes (di) and satisfies the minimum condition of equation below:

$$3di^2 = Do^2$$

in order to allow flow through each of the gas mixture supply and gas carrier tubes.

7. The system of claim 1, wherein the main chamber comprises:
   an atmospheric gas nozzle being formed on one side of the main chamber and spraying an atmospheric gas;
   a gas mixture nozzle spraying a gas mixture containing a doping gas in an opposite direction to a direction in which the atmospheric gas nozzle sprays the atmospheric gas such that the atmospheric gas is mixed with the doping gas;
   the door via which the wafer is loaded into and unloaded out from the main chamber; and
   the exhaust port exhausting the waste gas after the doping gas reacts with the wafer.

8. The system of claim 7, wherein the gas mixture nozzle is a back nozzle formed at a terminal portion of the gas mixture supply tube that extends from the premixer into the main chamber.

9. The system of claim 7, further comprising a reactive gas supply tube being connected to a portion of an atmospheric gas tube that in turn is connected to the atmospheric gas nozzle, wherein the atmospheric gas tube supplies the atmospheric gas along with reactive gas from the reactive gas supply tube to the main chamber via the atmospheric gas tube.

10. The system of claim 1, wherein the double sandwich structure of the door comprises a surface of the quartz is in direct contact with a surface of graphite, and wherein the quartz provides resistance to melting at high temperature and the graphite provides thermal transmissivity between the main chamber and the buffer case.

11. The system of claim 7, wherein the buffer case hermetically seals the wafer inside the door and seals the door and the exhaust port of the main chamber, wherein the buffer case further includes a shower nozzle on the buffer case for spraying a cooling gas to cool the wafer unloaded from the main chamber and to cool the waste gas.

12. The system of claim 1, wherein the waste gas exhausting system comprises:
   an exhausting tube;
   a supporting system for correcting thermal expansion in axial and radial directions of the exhausting tube; and
   a scrubber for exhausting the waste gas, wherein a cooling gas is provided outside of the main chamber.

13. The system of claim 12, wherein the supporting system comprises:
   a spring supporting the exhausting tube in a radial direction; and
   a bellows supporting the exhausting tube in an axial direction and cooling the waste gas with an increased surface area, wherein the cooling gas is a low-temperature inert gas that does not mix with the gas mixture.

14. A premixer for supplying a gas mixture containing a doping gas to a main chamber in which the gas mixture reacts with a wafer, the premixer comprising:

a premixer container;

two or more gas carrier tubes at least one gas carrier tube carrying the doping gas and at least one gas carrier tube carrying reactive gases;

a gas mixture supply tube supplying a gas mixture of the doping gas and the reactive gases from the premixer container to the main chamber;

a door on the main chamber; and a premixer heater controlling the temperature of the premixer container and the gas mixture, wherein a first portion of the premixer container that exhausts the gas mixture to the gas mixture supply tube has a tapering or conic interior shape between a second and a third portion of the premixer container, wherein the second portion is between the heater and two or more gas carrier tubes within the premixer container, and the third portion is adjacent to the gas mixture supply tube, and wherein the premixer includes a single premixer heater and/or the two or more gas carrier tubes extend into the volume of the premixer, and wherein the door has a double insulation structure with a double sandwich structure with two elements with two surfaces combined to form a door, wherein the first element is formed of quartz and the second element is formed of graphite.

15. The premixer of claim 14, wherein the gas carrier tubes extend into the center portion of the premixer container to spray gases.

16. The premixer of claim 14, wherein the diameter of the gas mixture supply tube (Do) is 1.7 times or more greater than the diameter of each of the gas carrier tubes (di) and satisfies the minimum condition of equation below:

$$3di^2 = Do^2$$

in order to allow flow through each of the gas mixture supply and gas carrier tubes.

17. A main chamber of a diffusion system in which a wafer reacts to gases, the main chamber comprising:

an atmospheric gas nozzle formed on one side of the main chamber and spraying an atmospheric gas;

a gas mixture nozzle spraying a gas mixture containing a doping gas in an opposite direction to a direction in which the atmospheric gas nozzle sprays the atmospheric gas such that the atmospheric gas is mixed with the doping gas;

a door via which the wafer is loaded into and unloaded out from the main chamber; and an exhaust port exhausting waste gas after the doping gas reacts to the wafer, wherein the door has a double insulation structure with a double sandwich structure with two elements with two surfaces combined to form a door, wherein the first element is formed of quartz and the second element is formed of graphite.

18. The main chamber of claim 17, wherein the gas mixture nozzle is a back nozzle that extends into the main chamber and is formed at a terminal portion of a gas mixture tube formed in the direction in which the atmospheric gas nozzle is disposed.

19. The main chamber of claim 17, further comprising a reactive gas supply tube connected to a portion of an atmospheric gas tube that in turn is connected to the atmospheric gas nozzle, wherein the atmospheric gas tube supplies the atmospheric gas along with reactive gas from the reactive gas supply tube to the main chamber via the atmospheric gas tube.

20. The main chamber of claim 17, wherein the door has a double sandwich structure of a surface of the quartz is in direct contact with a surface of graphite, and wherein the quartz provides resistance to melting at high temperature and the graphite provides thermal transmissivity between the main chamber and the buffer case.

21. A waste gas exhausting system for exhausting waste gas from a main chamber after a wafer reacts to gases, the waste gas exhausting system comprising:

an exhausting tube;

a supporting system for correcting thermal expansion in axial and radial directions of the exhausting tube and cooling the waste gas;

a scrubber for exhausting the waste gas using a vacuum pump connected to a terminal portion of the scrubber;

a shower nozzle cooling the waste gas in the exhausting tube by spraying a low-temperature inert gas toward the exhausting tube connected to the exhaust port of the main chamber; and a door on the main chamber; wherein the supporting system comprises:

a spring attached to upper and lower portions of the exhausting tube downstream from the shower nozzle to compensate for radial thermal expansion caused by the cooling by the shower nozzle; and a bellows downstream from the shower nozzle correcting axial thermal expansion of the exhausting tube caused by the cooling by the shower nozzle and further cooling the waste gas with an increased surface area, and wherein the low-temperature inert gas does not mix with the waste gas and/or is provided outside the main chamber, and wherein the door has a double insulation structure with a double sandwich structure with two elements with two surfaces combined to form a door, wherein the first element is formed of quartz and the second element is formed of graphite.

22. A diffusion system for forming a doping layer in a wafer, the system comprising:

a bubbler generating a doping gas;

a premixer premixing the doping gas with reactive gases and preheating the gas mixture;

a main chamber, in which the gas mixture reacts with the wafer;

a buffer case surrounding at least a portion of the main chamber and externally isolating an exhaust port and a door on the main chamber, wherein the door allows for loading and unloading the wafer into and out from the main chamber; and a waste gas exhaustion system exhausting waste gas after the reaction is finished in the main chamber, wherein the main chamber comprises:

an atmospheric gas nozzle being formed on one side of the main chamber and spraying an atmospheric gas;

a gas mixture nozzle spraying a gas mixture containing a doping gas in an opposite direction to a direction in which the atmospheric gas nozzle sprays the atmospheric gas such that the atmospheric gas is mixed with the doping gas; and an exhaust port exhausting the waste gas after the doping gas reacts to the wafer, wherein the buffer case hermetically seals the door and the exhaust port of the main chamber within the region of the main chamber surrounded by the buffer case, wherein the door has a double insulation structure with a double sandwich structure with two elements with two surfaces combined to form a door, wherein the first element is formed of quartz and the second element is formed of graphite.

* * * * *